(12) United States Patent
Bold

(10) Patent No.: US 7,863,184 B1  
(45) Date of Patent: Jan. 4, 2011

(54) SYSTEM AND METHOD FOR REDUCING CORROSION OF AN INTEGRATED CIRCUIT THROUGH ITS BOND PADS

(75) Inventor: Thomas Bold, Roanoke, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 15 days.

(21) Appl. No.: 12/456,116

(22) Filed: Jun. 11, 2009

Related U.S. Application Data

(62) Division of application No. 11/711,384, filed on Feb. 27, 2007, now Pat. No. 7,557,455.

(51) Int. Cl.  
H01L 21/00 (2006.01)

(52) U.S. Cl. .................. 438/636; 438/72; 257/E23.02; 257/499

(58) Field of Classification Search .................. 438/636, 438/72  
See application file for complete search history.

(56) References Cited

U.S. PATENT DOCUMENTS

| | | | |
|---|---|---|---|
| 5,444,012 A | | 8/1995 | Yoshizumi et al. |
| 5,563,762 A | | 10/1996 | Leung et al. |
| 5,789,303 A | * | 8/1998 | Leung et al. ................ 438/381 |
| 5,798,568 A | | 8/1998 | Abercrombie et al. |
| 5,814,563 A | | 9/1998 | Ding et al. |
| 6,143,646 A | * | 11/2000 | Wetzel ........................ 438/637 |
| 6,452,284 B1 | * | 9/2002 | Sheck ........................ 257/797 |
| 6,677,226 B1 | * | 1/2004 | Bowen et al. ............... 438/601 |
| 6,750,129 B2 | | 6/2004 | Yang et al. |
| 6,866,943 B2 | | 3/2005 | Friese et al. |
| 6,903,644 B2 | * | 6/2005 | Wang et al. ................. 336/200 |
| 7,008,841 B2 | * | 3/2006 | Kim et al. ................... 438/250 |
| 2007/0238304 A1 | | 10/2007 | Wu |

OTHER PUBLICATIONS

Thomas J. Barbieri et al., "Vanishing TiN ARC Coating as an Indicator of EOS in Aluminum Top Metal Lines", Proceedings of the 32nd International Symposium for Testing and Failure Analysis, Nov. 12-16, 2006, pp. 461, 468.

Rodney Hill, "System and Method for Preventing Metal Corrosion on Bond Pads", U.S. Appl. No. 11/514,621, filed Sep. 1, 2006.

* cited by examiner

*Primary Examiner*—Jarrett J Stark  
*Assistant Examiner*—Nicholas Tobergte

(57) ABSTRACT

A bond pad structure has a first conductive layer and an anti-reflective coating layer disposed on the first conductive layer. The first conductive layer includes first and second portions (which could be formed by etching). Part of the first portion is exposed within a bond pad opening, and the second portion is electrically connected to an integrated circuit. The anti-reflective coating layer also includes first and second portions (which could be formed by etching). The first portion may be located near the bond pad opening, and the second portion may be located farther away from the bond pad opening. A second conductive layer electrically connects the first and second portions of the first conductive layer. In this way, the first portion of the anti-reflective coating layer may undergo oxidation without leading to oxidation of the second portion of the anti-reflective coating layer.

20 Claims, 4 Drawing Sheets

SYSTEM AND METHOD FOR REDUCING CORROSION OF AN INTEGRATED CIRCUIT THROUGH ITS BOND PADS

This application is a divisional of prior U.S. patent application Ser. No. 11/711,384 filed on Feb. 27, 2007 now U.S. Pat. No. 7,557,455.

TECHNICAL FIELD

This disclosure is generally directed to integrated circuits and more specifically to a system and method for reducing corrosion of an integrated circuit through its bond pads.

BACKGROUND

Integrated circuits routinely include bond pads, which are used to electrically connect the integrated circuits to external circuits or devices. A bond pad typically includes metal or other conductive material electrically connected to other elements of an integrated circuit. The metal or other conductive material is also exposed for receiving a wire or other type of lead from an external circuit or device. In this way, the external circuit or device is electrically coupled to the integrated circuit through the bond pad.

A bond pad is typically formed by etching through one or more layers of material to reveal an underlying metal layer. The layers that are etched often include a passivation layer and an anti-reflective coating (ARC) layer. The anti-reflective coating layer often represents the top layer of a metal stack forming the metal layer. The metal stack itself is typically formed on an underlying oxide layer.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
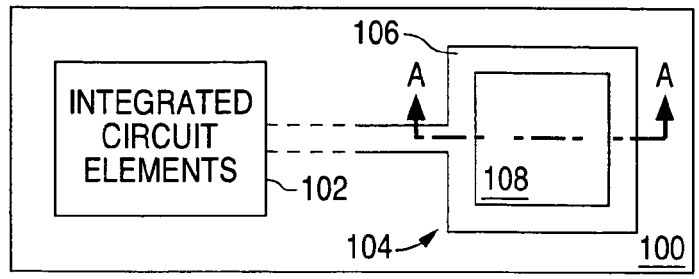
FIG. 1 illustrates an example integrated circuit according to one embodiment of this disclosure.

FIG. 1 illustrates an example integrated circuit 100 according to one embodiment of this disclosure. The embodiment of the integrated circuit 100 shown in FIG. 1 is for illustration only. Other embodiments of the integrated circuit 100 may be used without departing from the scope of this disclosure.

As shown in FIG. 1, the integrated circuit 100 includes various integrated circuit elements 102. The integrated circuit elements 102 represent any suitable components forming circuitry operable to perform any suitable function. For example, the integrated circuit elements 102 could include transistors, logic gates, latches, flip-flops, and other circuit elements. The integrated circuit elements 102 represent any suitable integrated circuit structures arranged to perform one or more functions.

The integrated circuit 100 also includes one or more bond pad structures 104. The bond pad structures 104 represent portions of the integrated circuit 100 that can be electrically connected to one or more external circuits or devices. The bond pad structures 104 are also electrically connected to the integrated circuit elements 102. In this way, the bond pad structures 104 provide for electrical connection of the external circuits or devices to the integrated circuit elements 102.

In this example, the bond pad structure 104 includes an underlying metal layer 106 that is electrically connected to the integrated circuit elements 102. The metal layer 106 could be formed from any suitable conductive material or materials, such as one layer of metal or multiple layers of metal forming a stack. As particular examples, the metal layer 106 could be formed from aluminum, copper, titanium, titanium nitride, tungsten, or other metals. Also, the metal layer 106 could have any suitable size and shape.

An opening 108 through a packaging or one or more other layers of material(s) exposes the underlying metal layer 106 to an external circuit or device. The opening 108 may be formed through any suitable layer(s) of material(s). For example, the opening 108 could be formed though a passivation layer and an anti-reflective coating layer. The opening 108 could have any suitable size and shape.

Figure 2:
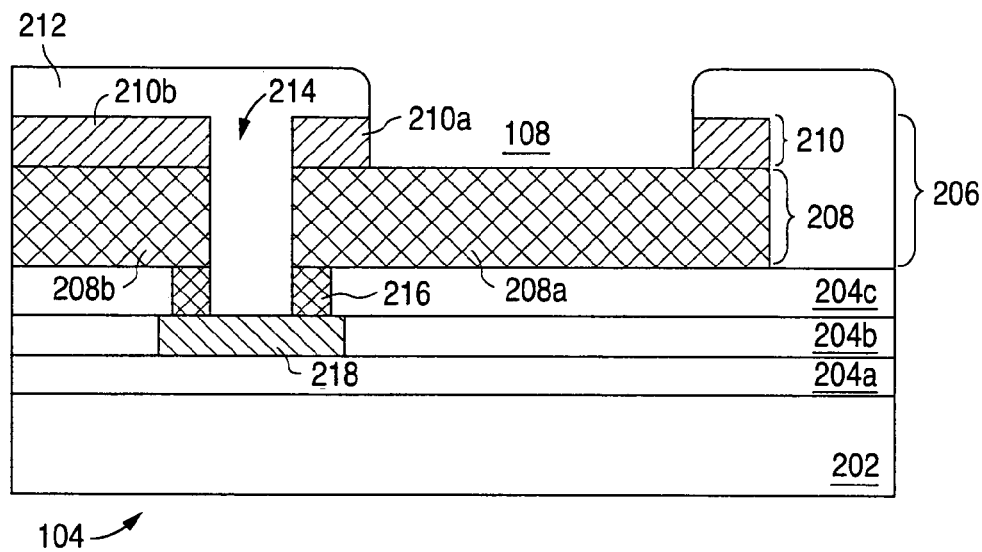
FIG. 2 illustrates an example bond pad structure in an integrated circuit according to one embodiment of this disclosure.

FIG. 2 illustrates an example bond pad structure 104 in an integrated circuit 100 according to one embodiment of this disclosure. The structure shown, in FIG. 2 represents a cross sectional view of the bond pad structure 104 taken along line A-A in FIG. 1. This embodiment of the bond pad structure 104 is for illustration only. Other embodiments of the bond pad structure 104 could be used without departing from the scope of this disclosure.

As shown in FIG. 2, the bond pad structure 104 is formed on a substrate 202. The substrate 202 represents any suitable structure for supporting the various elements of the integrated circuit 100. The substrate 202 could, for example, represent a silicon or other substrate. The bond pad structure 104 is also formed on or within one or more oxide layers 204a-204c. The oxide layers 204a-204c could each be formed from any suitable material(s), such as silicon dioxide. However, the bond pad structure 104 could be formed in any other suitable manner and need not be formed directly over or within the substrate 202 and oxide layers 204a-204c.

In this example, the underlying metal layer 106 of the bond pad structure 104 is formed from a metal stack 206, which includes a metal layer 208 and an anti-reflective coating layer 210. The metal stack 206 could include any other suitable number of layers. The metal layer 208 provides electrical connection to the integrated circuit elements 102. The metal layer 208 includes any suitable conductive material or materials, such as aluminum, copper, titanium, titanium nitride, tungsten, or other metals. The metal layer 208 may or may not include a barrier layer (such as a nitride layer) along its top surface.

The anti-reflective coating layer 210 is formed or disposed on the metal layer 208 (either directly or indirectly, depending on whether a barrier layer or other intermediate layer is formed over the metal layer 208). The anti-reflective coating layer 210 represents a layer of material having a low reflectivity. This may be useful in certain situations, such as when a lower reflectivity helps to promote an etch. The anti-reflective coating layer 210 can be formed from any suitable material or materials, such as titanium, titanium nitride, tantalum nitride, titanium tungsten, or other metals.

In this example, a passivation layer 212 is formed over the bond pad structure 104. The passivation layer 212 covers the components of the bond pad structure 104 and protects the bond pad structure 104, such as by protecting the structure 1-04 from contaminants or damage caused by contact. The passivation layer 212 could be formed from any suitable material or materials, such as an oxide.

The opening 108 of the bond pad structure 104 exposes the metal layer 208 and is formed through the passivation layer 212 and the anti-reflective coating layer 210. The opening 108 in the passivation layer 212 and the anti-reflective coating layer 210 can be formed in any suitable manner, such as by using a pattern and etch.

As shown in FIG. 2, the metal layer 208 and the anti-reflective coating layer 210 are not continuous layers between the opening 108 and the integrated circuit elements 102. Rather, an opening 214 divides the metal layer 208 and the anti-reflective coating layer 210. Portions of the metal layer 208 and the anti-reflective coating layer 210 remain near the opening 108, while other portions of the metal layer 208 and the anti-reflective coating layer 210 remain closer to the integrated circuit elements 102. In this example, the two portions of the metal layer 208 are connected by means of connectors 216 to an underlying metal layer 218. The connectors 216 and the metal layer 218 could each be formed from any suitable conductive material or materials, such as aluminum, copper, titanium, titanium nitride, tungsten, or other metals. The connectors 216 could represent vias, plugs, or any other suitable structures.

In conventional integrated circuits, an anti-reflective coating layer could suffer from corrosion when the integrated circuits are placed into use. For example, an integrated circuit with a titanium nitride anti-reflective coating layer in a plastic package could be used in a water-based or high-humidity environment, where a bond pad is biased with a high voltage (such as a 16V, 20V, or 48V bias). The exposure of the anti-reflective coating layer to this or other environments could lead to corrosion of the anti-reflective coating layer. For instance, the anti-reflective coating layer could experience oxidation.

In conventional integrated circuits, oxidation of the anti-reflective coating layer may increase the thickness of the anti-reflective coating layer, which increases the pressure on the overlying passivation layer. This increased pressure could cause the passivation layer to flex or even crack. These cracks could be confined to individual bond pads or propagate to adjacent bond pads. These cracks damage the integrated circuits and can render the integrated circuits inoperable.

In FIG. 2, this problem is reduced or eliminated by dividing the anti-reflective coating layer 210 into multiple portions 210a-210b and by dividing the metal layer 208 into multiple portions 208a-208b. The portion 208a of the metal layer 208 serves as the exposed metal of the bond pad structure 104, and the portion 208b of the metal layer 208 is electrically connected to the integrated circuit elements 102 (possibly through an electro-static discharge clamp, resistors, or other elements). The portion 210a of the anti-reflective coating layer 210 is located adjacent to the opening 108 (it may represent a portion of the anti-reflective coating layer 210 that rings or surrounds the opening 108) above the portion 208a of the metal layer 208. The portion 210b of the anti-reflective coating layer 210 is located farther away from the opening 108 and is above the portion 208b of the metal layer 208. The metal layer 218 electrically connects the two portions 208a-208b of the metal layer 208, which are separated by the opening 214.

In this configuration, any oxidation of the anti-reflective coating layer 210 may be confined to the portion 210a of the anti-reflective coating layer 210. The oxidation may not continue into the other portion 210b of the anti-reflective coating layer 210. Because of this, the amount of oxidation of the anti-reflective coating layer 210 may be less than in conventional bond pad structures. This may help to reduce the pressure applied on the passivation layer 212 caused by the oxidation, reducing the likelihood of failure.

Although FIG. 1 illustrates one example of an integrated circuit 100 and FIG. 2 illustrates one example of a bond pad structure 104 in an integrated circuit 100, various changes may be made to FIGS. 1 and 2. For example, the relative dimensions (such as shapes, thicknesses, and sizes) of the various layers shown in FIGS. 1 and 2 are for illustration only and are not necessarily drawn to scale. As a particular example, the sizes of various layers in FIG. 2 may be exaggerated for clarity and ease of description. Also, the specific layers shown in FIG. 2 are for illustration only. Various ones of the layers could be combined or further subdivided according to particular manufacturing or other techniques. As an example, while the layers 204a and 204b are shown as separate layers, the layers 204a and 204b could be formed during a single step (such as during a single oxide deposition step). Similarly, while the layers 204b and 204c are shown as separate layers, the layers 204b and 204c could be formed during a single step (such as during a single oxide deposition step). As another example, the connectors 216 and the metal layer 208 could be formed during a single step (such as during a single metal deposition step).

FIGS. 3A through 3H illustrate an example manufacturing process for manufacturing a bond pad structure 104 in an integrated circuit 100 according to one embodiment of this disclosure. The manufacturing process shown in FIGS. 3A through 3H is for illustration only. Other manufacturing processes could be used to manufacture the bond pad structure 104 without departing from the scope of this disclosure.

Figure 3A:
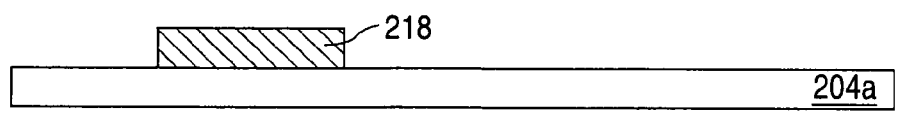
FIGS. 3A through 3H illustrate an example manufacturing process for manufacturing a bond pad structure in an integrated circuit according to one embodiment of this disclosure.
Figure 3B:
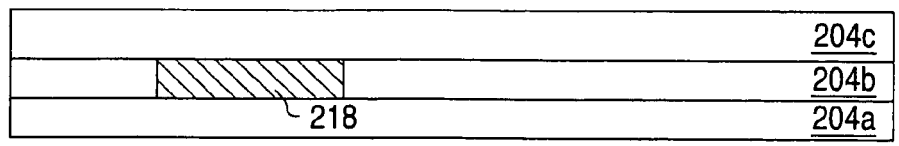

In FIG. 3A, the metal layer 218 is formed on the oxide layer 204a. The metal layer 218 could be formed in any suitable manner, such as by depositing a layer of metal on the oxide layer 204a and then etching the layer of metal to form the metal layer 218. In FIG. 3B, the metal layer 218 is surrounded by the oxide layers 204b and 204c. The oxide layers 204a-204c could be formed in one or multiple steps and in any suitable manner, such as by using chemical vapor deposition. In other embodiments, the oxide layer 204b could be formed on top of or during the formation of the oxide layer 204a and then etched, and the metal layer 218 could be formed within the etched oxide layer 204b.

Figure 3C:
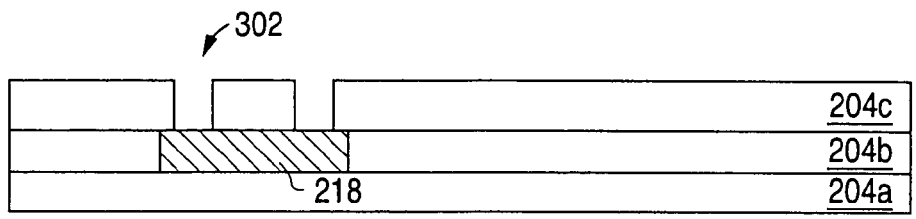
Figure 3D:
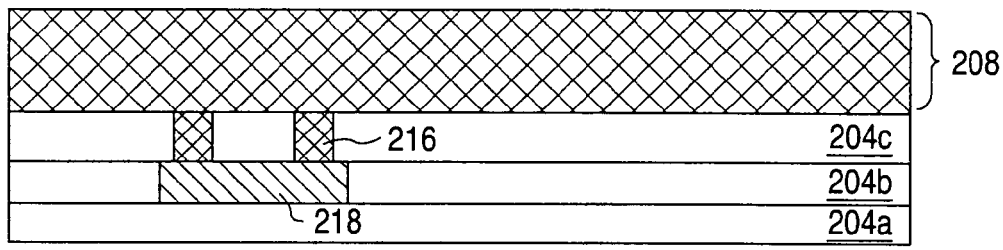

In FIG. 3C, openings 302 are formed in the oxide layer 204c. The openings 302 could be formed in any suitable manner, such as by using a pattern and etch. In FIG. 3D, a metal or other conductive material or materials are deposited on the oxide layer 204c and in the openings 302 to form the connectors 216 and the metal layer 208. The metal or other conductive material or materials could be deposited in any suitable manner. While shown as occurring in a single step, the connectors 216 and the metal layer 208 could be formed during separate or multiple steps. Also, while shown as forming two connectors 216, any suitable number of connectors 216 could be formed.

Figure 3E:
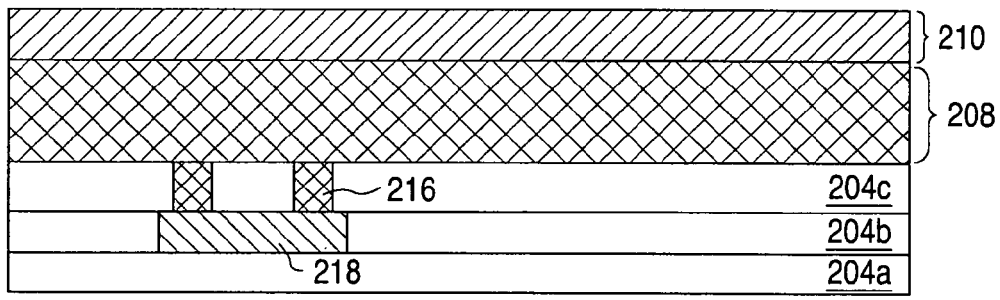
Figure 3F:
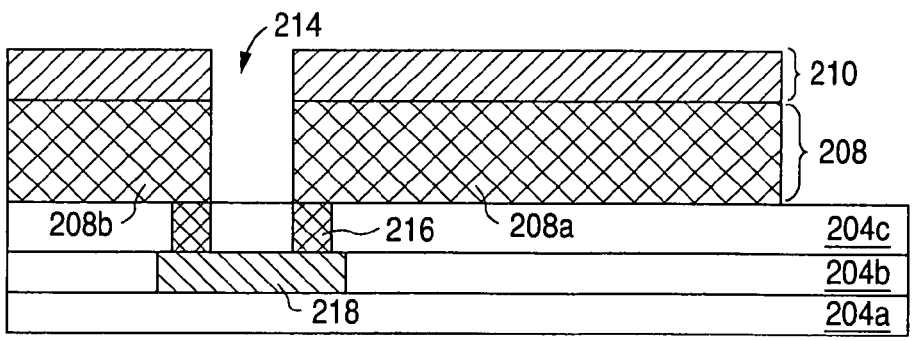

In FIG. 3E, the anti-reflective coating layer 210 is deposited on the metal layer 208. The anti-reflective coating layer 210 could be deposited in any suitable manner. In FIG. 3F, the anti-reflective coating layer 210 and the metal layer 208 are etched. This includes forming the opening 214 in the anti-reflective coating layer 210 and the metal layer 208. This divides the metal layer 208 and the anti-reflective coating layer 210 in multiple portions. The opening 214 could have any suitable width. In particular embodiments, the opening 214 could have a width that is twice the thickness of the passivation layer 212 to be formed on the anti-reflective coating layer 210. For example, if the passivation layer thickness will be 1.9 microns, the opening 214 could be at least 3.8 microns wide (such as 5 microns). This may help to prevent cracks in the passivation layer 212 over the portion 210a of the anti-reflective coating layer 210 from propagating to the passivation layer 212 over the portion 210b of the anti-reflective coating layer 210.

Figure 3G:
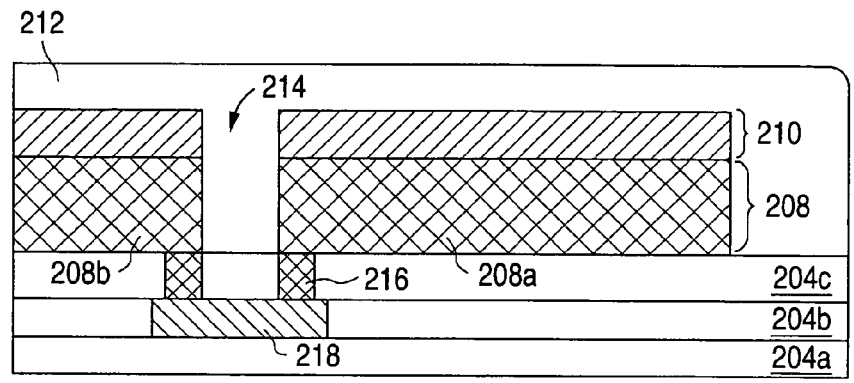
Figure 3H:
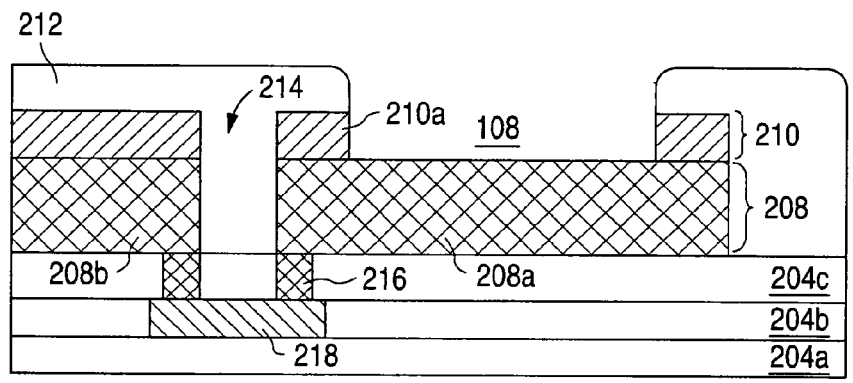

In FIG. 3G, the passivation layer 212 is formed over the bond pad structure 104. The passivation layer 212 could be formed in any suitable manner, such as by using chemical vapor deposition. In FIG. 3H, the passivation layer 212 and the anti-reflective coating layer 210 are etched to form the opening 108. This exposes the portion 208a of the metal layer 208 for connection to an external circuit or device via a wire or other lead. This also leads to the formation of the portion 210a of the anti-reflective coating layer 210 around the bond pad opening 108. In particular embodiments, the passivation layer 212 and the portion 210a of the anti-reflective coating layer 210 overlap the portion 208a of the metal layer 208 by 3.2 µm. This means that the portion 210a of the anti-reflective coating layer 210 has a width of 3.2 µm.

Dividing the anti-reflective coating layer 210 into the two portions 210a-210b may help to reduce corrosion of the integrated circuit 100 by limiting oxidation of the anti-reflective coating layer 210 to the portion 210a. Oxidation of the anti-reflective coating layer 210 could be limited to the narrow area surrounding the opening 108, rather than involving a larger portion of the anti-reflective coating layer 210.

Although FIGS. 3A through 3H illustrate one example of a manufacturing process for manufacturing a bond pad structure 104 in an integrated circuit 100, various changes may be made to FIGS. 3A through 3H. For example, the bond pad structure 104 could be manufactured in any other suitable manner, several examples of which have been described above.

Figure 4:
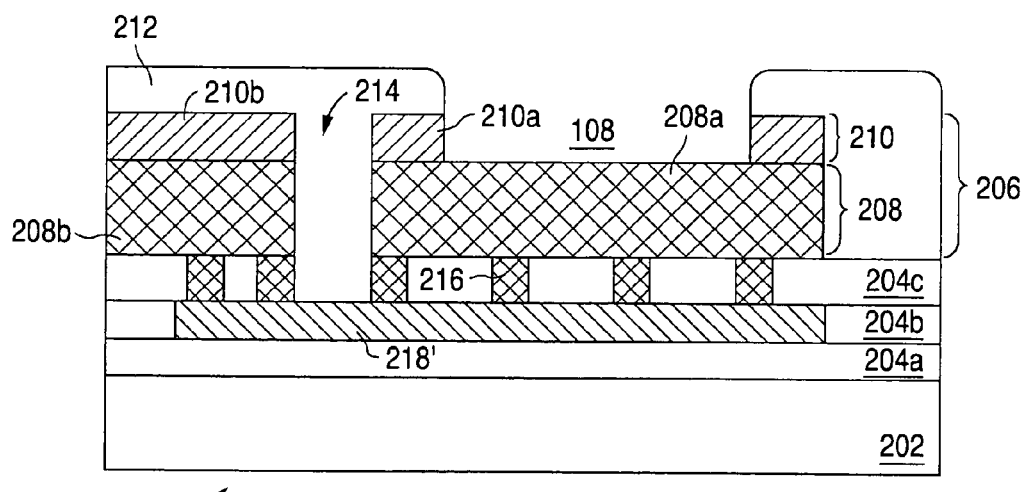
FIG. 4 illustrates another example bond pad structure in an integrated circuit according to one embodiment of this disclosure.

FIG. 4 illustrates another example bond pad structure 104 in an integrated circuit 100 according to one embodiment of this disclosure. The structure shown in FIG. 4 also represents a cross sectional view of the bond pad structure 104 taken along line A-A in FIG. 1. This embodiment of the bond pad structure 104 is for illustration only. Other embodiments of the bond pad structure 104 could be used without departing from the scope of this disclosure.

The bond pad structure 104 shown in FIG. 4 is similar to the bond pad structure 104 shown in FIG. 2, and many of the same components are present in both structures. However, as shown in FIG. 4, the underlying metal layer 218' that connects the portions 208a-208b of the metal layer 208 actually forms part of the bond pad under the bond pad opening 108. Also, more connectors 216 connect the portions 208a-208b of the metal layer 208 to the underlying metal layer 218' (although the number shown in FIG. 4 is for illustration only).

Stacked bond pad structures can include multiple layers of metal or other conductive material(s) stacked on top of one another that are joined through vias or other connections. The stacked layers can help to reinforce the bond pad under the bond pad opening 108. This may help to reduce or prevent damage to the bond pad structure 104 or the underlying substrate 202 when a wire or other lead is attached to the exposed portion 208a of the metal layer 208.

In these embodiments, the upper metal layer 208 is split into multiple portions 208a-208b, and the lower layer 218' couples the portions 208a-208b together and reinforces the metal layer 208. The bond pad structure 104 shown in FIG. 4 could be manufactured in a similar manner as is shown in FIGS. 3A through 3H. It could, for example, involve a modification to the fabrication of the underlying layer 218 (such as by increasing the width of the layer 218) and an increase in the number and locations of the openings 302 (to increase the number of connectors 216 formed). The remaining steps shown in FIGS. 3A through 3H could occur as shown.

Although FIG. 4 illustrates another example of a bond pad structure 104 in an integrated circuit 100, various changes, could be made to FIG. 4. For example, the relative dimensions (such as shapes, thicknesses, and sizes) of the various layers shown in FIG. 4 are for illustration only and are not necessarily drawn to scale. As a particular example, the sizes of various layers in FIG. 4 may be exaggerated for clarity and ease of description. Also, while shown as using two layers to form a stacked bond pad, any number of layers could be used to form the bond pad, and the two portions 208a-208b could be electrically connected using any of the layer(s) in the stack.

Figure 5:
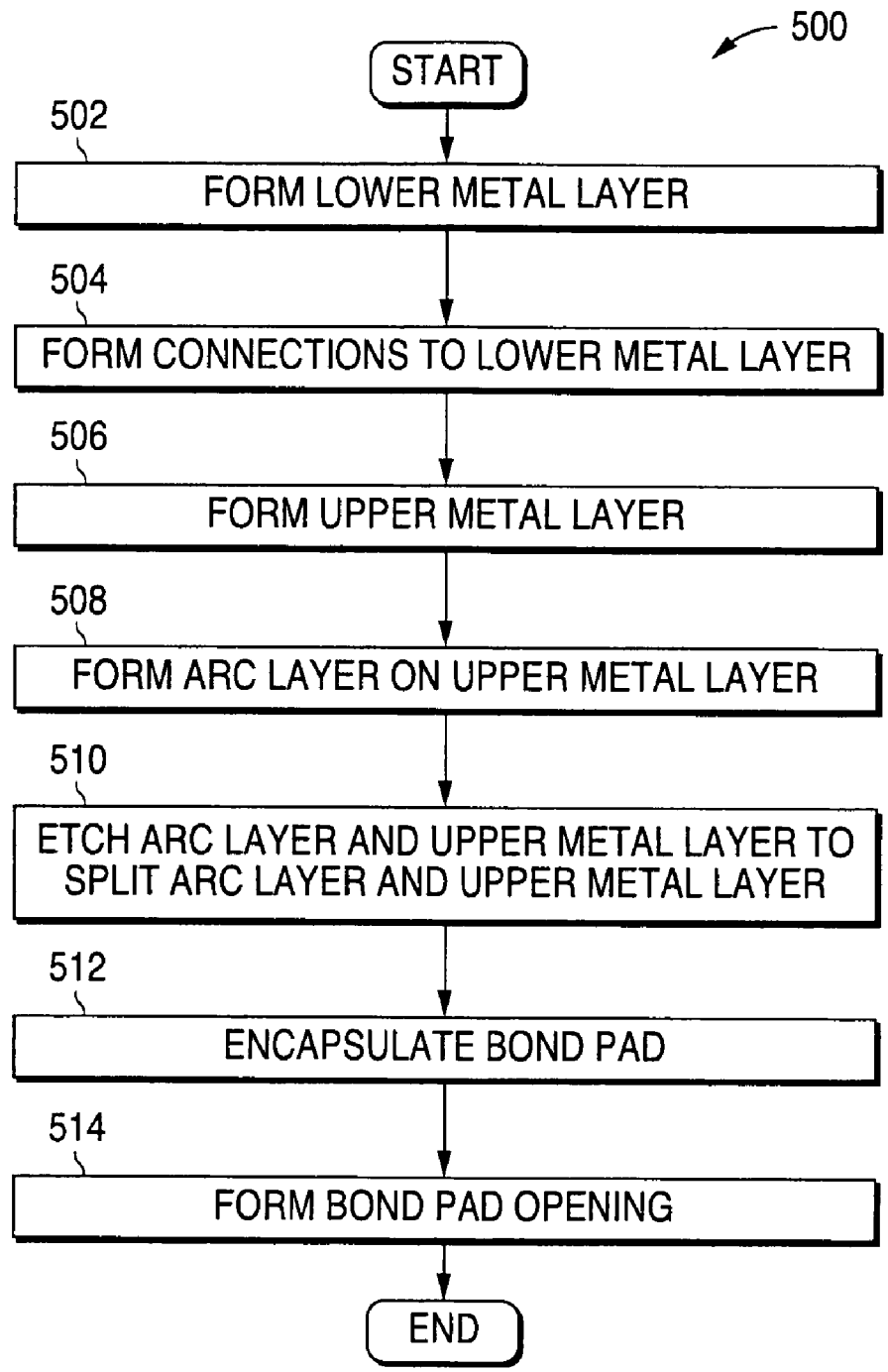
FIG. 5 illustrates an example method for forming a bond pad structure in an integrated circuit according to one embodiment of this disclosure.

FIG. 5 illustrates an example method 500 for forming a bond pad structure 104 in an integrated circuit 100 according to one embodiment of this disclosure. The embodiment of the method 500 shown in FIG. 5 is for illustration only. Other embodiments of the method 500 could be used without departing from the scope of this disclosure.

A lower metal layer is formed in the bond pad structure 104 at step 502. This could include, for example, forming the metal layer 218 on top of the oxide layer 204a or in a trench formed in the oxide layer 204b. The metal layer 218 could be formed from any suitable conductive material(s). Also, the metal layer 218 may or may not include a portion located completely under an area that will become the bond pad opening 108.

Connections to the lower metal layer are formed at step 504. This could include, for example, forming the oxide layer 204c over the metal layer 218. This could also include forming openings 302 in the oxide layer 204c. This could further include depositing metal or other conductive material(s) in the openings 302 to form the connectors 216. Any suitable number of connectors 216 could be formed, and any suitable locations for the connectors 216 could be used.

An upper metal layer is formed at step 506. This could include, for example, forming the metal layer 208 over the oxide layer 204c. The metal layer 208 could be formed from any suitable conductive material(s). Although shown as separate steps, the connections and the upper metal layer could be formed during a single manufacturing step.

An ARC layer is formed on the upper metal layer at step 508. This could include, for example, forming the anti-reflective coating layer 210 over the metal layer 208. The anti-reflective coating layer 210 could be formed from any suitable conductive material(s).

The upper metal layer and the ARC layer are etched at step 510. This could include, for example, forming an opening 214 in the anti-reflective coating layer 210 and the metal layer 208. This divides the anti-reflective coating layer 210 into multiple portions. This also divides the metal layer 208 into multiple portions.

The bond pad structure 104 is encapsulated at step 512 and the bond pad opening 108 is formed at step 514. This could include, for example, forming a passivation layer 212 on top of the bond pad structure 104 and etching the passivation layer 212 to form the opening 108. The etching also etches through part of the anti-reflective coating layer 210 to expose the portion 208a of the metal layer 208. The portion 210a of the anti-reflective coating layer 210 remains around the bond pad opening 108, and oxidation of the anti-reflective coating layer 210 could be limited to this portion 210a of the anti-reflective coating layer 210.

Although FIG. 5 illustrates one example of a method 500 for forming a bond pad structure 104 in an integrated circuit 100, various changes may be made to FIG. 5. For example, various structures in the bond pad structure 104 could be formed in any other suitable manner or in a different order.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. In addition, terms implying a directional relationship (such as "top," "upper," and "lower") are used only with respect to the drawings and are not meant to limit the scope of this disclosure.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
   forming a first conductive layer comprising a first portion and a second portion, part of the first portion of the first conductive layer exposed within a bond pad opening, the second portion of the first conductive layer electrically connected to an integrated circuit;
   forming an anti-reflective coating layer comprising a first portion and a second portion, the first portion of the anti-reflective coating layer disposed on the first portion of the first conductive layer, the second portion of the anti-reflective coating layer disposed on the second portion of the first conductive layer; and
   forming a second conductive layer electrically connecting the first and second portions of the first conductive layer.

2. The method of claim 1, wherein:
   forming the first conductive layer comprises etching the first conductive layer to form the first and second portions of the first conductive layer; and
   forming the anti-reflective coating layer comprises etching the anti-reflective coating layer to form the first and second portions of the anti-reflective coating layer.

3. The method of claim 2, wherein both the first conductive layer and the anti-reflective coating layer are etched during a single etch.

4. The method of claim 1, wherein the second conductive layer is formed prior to formation of the anti-reflective coating layer and the first conductive layer.

5. The method of claim 1, further comprising:
   forming a passivation layer over the first conductive layer and the anti-reflective coating layer; and
   etching the passivation layer and the anti-reflective coating layer to form the bond pad opening.

6. The method of claim 1, wherein the first portion of the anti-reflective coating layer surrounds the bond pad opening on the first portion of the first conductive layer.

7. The method of claim 1, wherein the first portion of the first conductive layer is separated from and does not contact the second portion of the first conductive layer.

8. The method of claim 1, wherein the first portion of the anti-reflective coating layer is separated from and does not contact the second portion of the anti-reflective coating layer.

9. A method for forming an integrated circuit structure, the method comprising:
   forming a lower metal layer in a bond pad structure;
   forming an upper metal layer above the lower metal layer, the upper metal layer comprising a first portion and a second portion, part of the first portion of the upper metal layer exposed within a bond pad opening, the second portion of the upper metal layer electrically connected to an integrated circuit, wherein the lower metal layer electrically connects the first and second portions of the upper metal layer; and
   forming an anti-reflective coating layer comprising a first portion and a second portion, the first portion of the anti-reflective coating layer disposed on the first portion of the upper metal layer, the second portion of the anti-reflective coating layer disposed on the second portion of the upper metal layer.

10. The method of claim 9, wherein:
    forming the upper metal layer comprises etching the upper metal layer to form the first and second portions of the upper metal layer; and
    forming the anti-reflective coating layer comprises etching the anti-reflective coating layer to form the first and second portions of the anti-reflective coating layer.

11. The method of claim 10, wherein both the upper metal layer and the anti-reflective coating layer are etched during a single etch.

12. The method of claim 9, wherein the lower metal layer is formed prior to formation of the anti-reflective coating layer and the upper metal layer.

13. The method of claim 9, further comprising:
    forming a passivation layer over the upper metal layer and the anti-reflective coating layer; and
    etching the passivation layer and the anti-reflective coating layer to form the bond pad opening.

14. The method of claim 9, wherein the first portion of the anti-reflective coating layer surrounds the bond pad opening on the first portion of the upper metal layer.

15. The method of claim 9, wherein the first portion of the upper metal layer is separated from and does not contact the second portion of the first conductive layer.

16. The method of claim 9, wherein the first portion of the anti-reflective coating layer is separated from and does not contact the second portion of the anti-reflective coating layer.

17. A method for forming an integrated circuit structure, the method comprising:

etching a first conductive layer to form first and second portions of the first conductive layer, wherein part of the first portion of the first conductive layer is exposed within a bond pad opening and the second portion of the first conductive layer is electrically connected to an integrated circuit;

etching an anti-reflective coating layer to form first and second portions of the anti-reflective coating layer, wherein the first portion of the anti-reflective coating layer is disposed on the first portion of the first conductive layer and the second portion of the anti-reflective coating layer is disposed on the second portion of the first conductive layer; and forming a second conductive layer electrically connecting the first and second portions of the first conductive layer.

18. The method of claim 17, wherein both the first conductive layer and the anti-reflective coating layer are etched during a single etch.

19. The method of claim 17, further comprising:

forming a passivation layer over the first conductive layer and the anti-reflective coating layer; and etching the passivation layer and the anti-reflective coating layer to form the bond pad opening.

20. The method of claim 17, wherein the first portion of the anti-reflective coating layer surrounds the bond pad opening on the first portion of the first conductive layer.

* * * * *